United States Patent
Doyle et al.

(10) Patent No.: US 10,299,366 B2
(45) Date of Patent: May 21, 2019

(54) TAMPER DETECTION CIRCUITS

(71) Applicant: International Business Machines Corporation, Armonk, NY (US)

(72) Inventors: Matthew S. Doyle, Chatfield, MN (US); Joseph Kuczynski, North Port, FL (US); Kevin M. O'Connell, Rochester, MN (US); Chelsie M. Peterson, Dexter, MN (US); Mark. D. Plucinski, Rochester, MN (US); Timothy J. Tofil, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 216 days.

(21) Appl. No.: 14/820,201

(22) Filed: Aug. 6, 2015

(65) Prior Publication Data

US 2017/0042019 A1 Feb. 9, 2017

(51) Int. Cl.
| | |
|---|---|
| H05K 1/02 | (2006.01) |
| H05K 1/03 | (2006.01) |
| H05K 1/09 | (2006.01) |
| H05K 1/18 | (2006.01) |
| H05K 3/14 | (2006.01) |
| H01L 23/00 | (2006.01) |

(52) U.S. Cl.
CPC ......... *H05K 1/0213* (2013.01); *H05K 1/0274* (2013.01); *H05K 1/0275* (2013.01); *H05K 1/03* (2013.01); *H05K 1/09* (2013.01); *H05K 1/18* (2013.01); *H05K 3/143* (2013.01); *H01L 23/573* (2013.01); *H01L 23/576* (2013.01); *H05K 2201/0145* (2013.01); *H05K 2201/0323* (2013.01); *H05K 2201/0332* (2013.01)

(58) Field of Classification Search
CPC .. H05K 1/0213; H05K 1/0274; H05K 1/0275; H05K 1/03; H05K 1/09; H05K 1/18; H05K 3/143; H05K 2201/0332; H05K 2201/0323; H05K 2201/0145; H01L 23/57; H01L 23/573; H01L 23/576
See application file for complete search history.

(56) References Cited

U.S. PATENT DOCUMENTS

| | | | | |
|---|---|---|---|---|
| 4,811,288 | A * | 3/1989 | Kleijne | G06F 21/71 340/652 |
| 7,007,171 | B1 * | 2/2006 | Butturini | G06F 21/86 257/678 |
| 8,703,090 | B2 | 4/2014 | Tour et al. | |
| 2012/0126959 | A1 * | 5/2012 | Zarrabi | B06B 1/0688 340/407.1 |
| 2014/0291819 | A1 | 10/2014 | Barth | |

(Continued)

OTHER PUBLICATIONS

American Chemical Society. (2012). Organic Electronics for a Better Tomorrow: Innovation, Accessibility, Sustainability, San Francisco, California, USA: Chemical Sciences and Society Summit (CS3).*

(Continued)

*Primary Examiner* — Livius Radu Cazan
(74) *Attorney, Agent, or Firm* — Patterson + Sheridan, LLP

(57) ABSTRACT

In an example, a polymeric material is disclosed. The polymeric material includes a polymer substrate and a plurality of graphene traces arranged to form a tamper detection circuit on the polymer substrate.

11 Claims, 4 Drawing Sheets

(56) References Cited

U.S. PATENT DOCUMENTS

2015/0024122 A1* 1/2015 Wu .................... C09D 11/52
 427/122
2015/0057417 A1 2/2015 Tour et al.

OTHER PUBLICATIONS

Raji, et al., "Functionalized Graphene Nanoribbon Films as a Radiofrequency and Optically Transparent Material", Applied Materials & Interfaces, American Chemical Society, 2014, vol. 6, 8 pp.
List of IBM Patents or Patent Applications Treated as Related.

* cited by examiner

TAMPER DETECTION CIRCUITS

I. FIELD OF THE DISCLOSURE

The present disclosure relates generally to tamper detection circuits.

II. BACKGROUND

In some electronic devices, physical security mechanisms may be used to protect sensitive hardware and/or software (e.g., cryptographic modules). An example of a physical security standard is the United States Government Federal Information Processing Standards (FIPS) 140-2 Security Requirements for Cryptographic Modules—Level 4. The standard states that "[a]t this security level, the physical security mechanisms provide a complete envelope of protection around the cryptographic module with the intent of detecting and responding to all unauthorized attempts at physical access" (FIPS 140-42).

III. SUMMARY OF THE DISCLOSURE

According to an embodiment, a polymeric material is disclosed. The polymeric material includes a polymer substrate and a plurality of graphene traces arranged to form a tamper detection circuit.

According to another embodiment, an apparatus is disclosed. The apparatus includes a tamper detection circuit and a tamper protection circuit that is electrically connected to the tamper detection circuit. The tamper detection circuit includes a plurality of graphene traces, and the tamper protection circuit is configured to electrically connect to a tamper protected device.

According to another embodiment, a process is disclosed. The process includes forming a patterned layer on a polymer substrate. The process also includes depositing a graphene-containing material on the patterned layer to form a plurality of graphene traces of a tamper detection circuit.

One advantage of the present disclosure is the ability to detect a tamper event using graphene traces that are arranged to form a tamper detection circuit. Another advantage of the present disclosure is that the graphene traces arranged to form the tamper protection circuit may be difficult to identify using traditional optical inspection techniques, potentially providing additional protection for a tamper protected device.

Features and other benefits that characterize embodiments are set forth in the claims annexed hereto and forming a further part hereof. However, for a better understanding of the embodiments, and of the advantages and objectives attained through their use, reference should be made to the Drawings and to the accompanying descriptive matter.

IV. BRIEF DESCRIPTION OF THE DRAWINGS

V. DETAILED DESCRIPTION

The present disclosure relates to tamper detection circuits and methods of forming tamper detection circuits. In the present disclosure, graphene traces may be arranged to form a tamper detection circuit on a polymer substrate. Graphene is a one-atomic-layer thick two-dimensional material made of carbon atoms arranged in a honeycomb structure. Graphene nanoribbons (GNRs) are narrow strips of graphene. In some cases, the graphene traces of the present disclosure include graphene nanoribbons that are deposited on a patterned layer of a polymer substrate. The patterned layer may be formed using photolithography techniques, and GNRs may be applied to the patterned layer (e.g., by spray coating).

As an illustrative, non-limiting example, alkylated GNRs (e.g., hexadecylated GNRs, also referred to as HD-GNRs) may be patterned into a circuit trace to provide a tamper resistant layer that is electrically conductive yet invisible to the unaided eye. If a graphene trace is broken (e.g., via insertion of a probe), the change in electrical resistance may be detected, and an appropriate action may be triggered. The use of graphene nanoribbons, such as HD-GNRs, may improve security because the conductive traces may be fabricated to tighter lines/spaces/widths and are invisible using traditional optical inspection techniques.

In a particular embodiment, a polymeric material that includes a tamper detection circuit may be fabricated on a thin, flexible polymer substrate (e.g., a polyimide substrate, a polyethylene terephthalate (PET) substrate, a polycarbonate substrate, etc.). The polymer substrate may be masked, and HD-GNRs may be spray coated onto the masked polymer substrate. The masked regions define an appropriate sense circuit. The deposited circuit may then be coated with an opaque polyurethane or other suitable flexible coating. In some cases, the process may be repeated to provide multiple levels of security or an X-Y sensing grid. The flexible film may be wrapped around an electronic device (e.g., a cryptographic card/module) for tamper detection/prevention.

Figure 1:
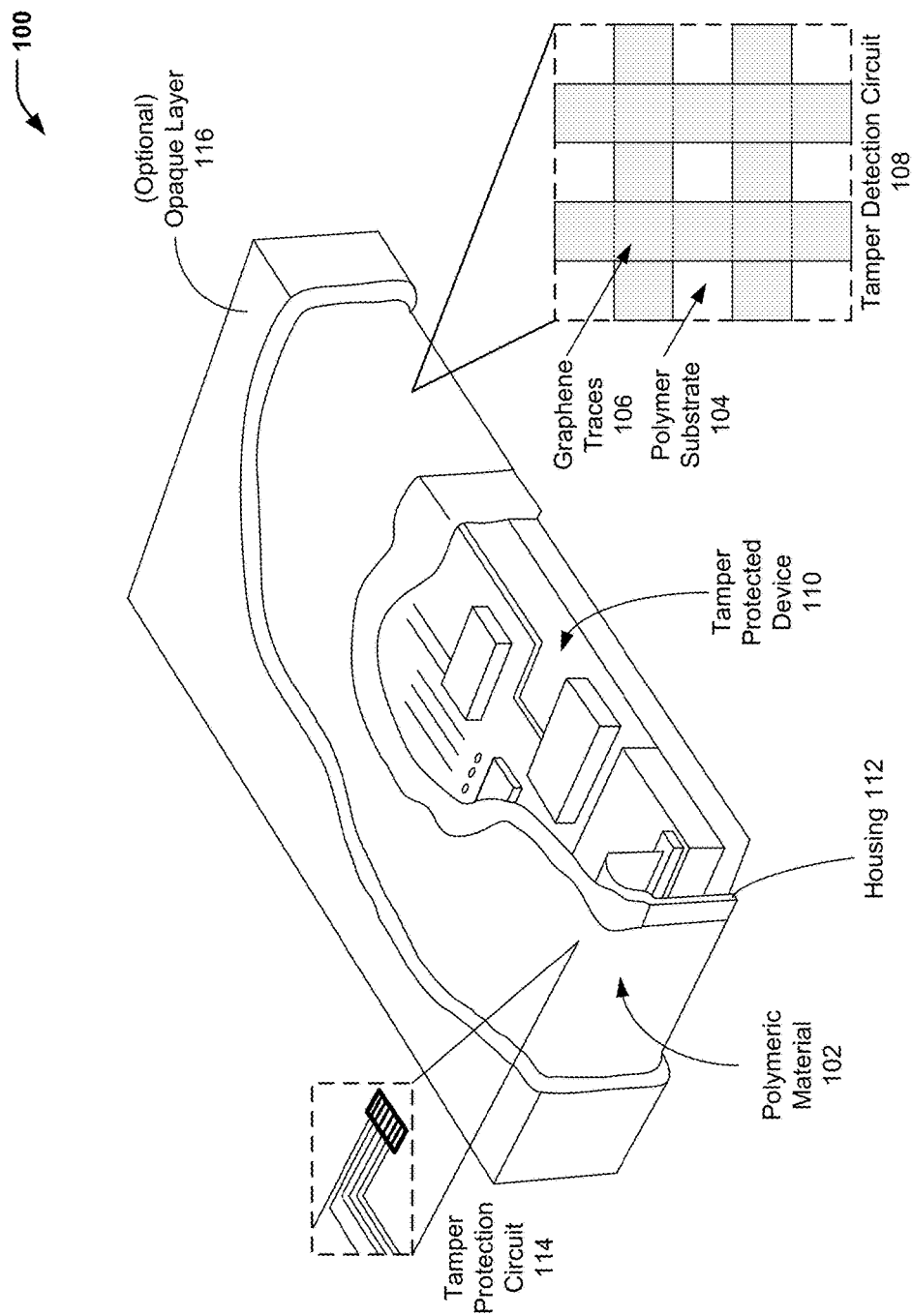
FIG. 1 is a diagram illustrating a device that is protected from tampering by use of a polymeric material having a plurality of graphene traces arranged to form a tamper detection circuit, according to one embodiment.

FIG. 1 is a view 100 illustrating that a device may be protected from tampering by use of a polymeric material having a plurality of graphene traces arranged to form a tamper detection circuit, according to one embodiment. FIG. 1 illustrates that, in some cases, the polymeric material includes a flexible polymer substrate that may be "wrapped" around a device for tamper detection. FIG. 1 further illustrates that an apparatus that includes the tamper detection circuit may also include a tamper protection circuit that is configured to electrically connect to a tamper protected device. The tamper protected device may be configured to perform one or more tamper response operations (e.g., erasing sensitive data, disabling components, etc.) responsive to receiving an indication of a tamper event.

FIG. 1 illustrates a polymeric material 102 that includes a polymer substrate 104 and a plurality of graphene traces 106 arranged to form a tamper detection circuit 108 on the polymer substrate 104. As illustrated and further described herein with respect to FIGS. 2 and 3, the plurality of graphene traces 106 may include graphene nanoribbons (e.g., alkylated graphene nanoribbons) that may be selectively applied to the polymer substrate 104 to form one or more layers of graphene traces. In the particular embodiment illustrated in FIG. 1, the tamper detection circuit 108 includes at least one layer of graphene traces that overlies another layer of graphene traces (identified via dashed lines). FIG. 1 shows an illustrative, non-limiting example in which the graphene traces 106 may be arranged to form an "X-Y sensing grid" for tamper detection, as illustrated and further described herein with respect to FIG. 3.

FIG. 1 illustrates that the polymeric material 102 that includes the tamper detection circuit 108 may be positioned to detect a tamper event for a tamper protected device 110. In the particular embodiment illustrated in FIG. 1, the tamper protected device 110 is enclosed within a housing 112, and the tamper detection circuit 108 is disposed on a flexible polymer substrate surrounding the housing 112.

FIG. 1 further illustrates that an apparatus that includes the tamper detection circuit 108 may further include a tamper protection circuit 114 that is electrically connected to the tamper detection circuit 108. The tamper protection circuit 114 may be configured to electrically connect to the tamper protected device 110. In some cases, the tamper protection circuit 114 may be a component of the tamper protected device 110. Alternatively, the tamper protection circuit 114 may be disposed on the polymeric material 102. In either case, the tamper detection circuit 108 may be configured to send an indication of a tamper event to the tamper protected device 110 responsive to detection of the tamper event. The tamper protected device 110 may be configured to perform one or more tamper response operations responsive to the indication of the tamper event. As illustrative, non-limiting examples, tamper response operations may include erasing data stored at a memory of the tamper protected device 110, disabling one or more components of the tamper protected device 110, or a combination thereof (among other alternatives).

In a particular embodiment, each graphene trace of the plurality of graphene traces 106 has a characteristic dimension in a range of about 2 millimeters to about 5 millimeters. FIG. 1 further illustrates that, in some cases, an opaque layer 116 may overly the plurality of graphene traces 106. While the plurality of graphene traces 106 may be optically transparent and may not be readily detectable using traditional optical inspection techniques, the opaque layer 116 may provide an additional layer of security for the tamper protected device 110.

In operation, the graphene traces 106 allow electric resistance to be measured for tamper detection. The graphene traces 106 may be used to measure resistance change based on compression, tension, shorts, and temperature changes. Monitoring resistance changes due to temperature may allow for detection of an attempt to remove the polymeric material 102 via cold (e.g., liquid nitrogen) or heat. A resistance value in an unstrained state may be determined for the graphene traces 106. When strained from compression or tension, the resistance of the graphene traces 106 changes. A particular resistance change may be associated with a tamper event, and the tamper protection circuit 114 may provide an indication to the tamper protected device 110 to perform one or more operations based on the tamper event. In a particular embodiment, the tamper protected device 110 may include a cryptographic module, and the operation(s) may include selectively (or non-selectively) erasing data, disabling component(s), or a combination thereof.

Thus, FIG. 1 illustrates that a polymeric material that includes graphene traces arranged to form a tamper detection circuit may be used to provide additional security for a tamper protected device. In the example of FIG. 1, the polymeric material includes a flexible polymer substrate, allowing the polymeric material to be wrapped around the tamper protected device. In some cases, the tamper detection capability provided by the polymeric material may be sufficient to satisfy FIPS 140-2 Security Requirements for Cryptographic Modules—Level 4 (among other possible security standards).

Figure 2:
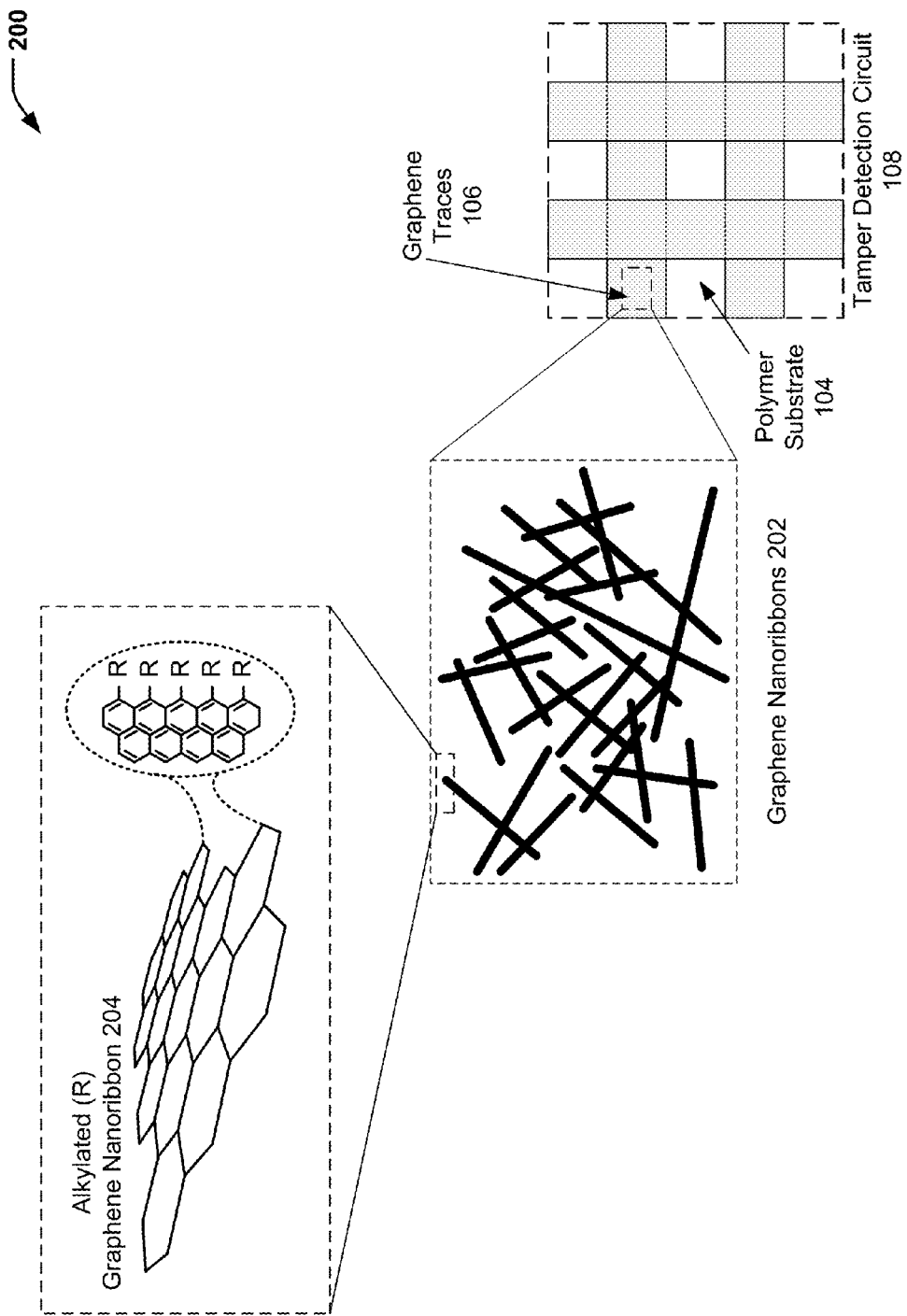
FIG. 2 is a diagram illustrating that graphene traces that are arranged to form a tamper detection circuit may include graphene nanoribbons that are selectively applied to a polymer substrate, according to one embodiment.

FIG. 2 is a view 200 illustrating that the graphene traces 106 of FIG. 1 may include graphene nanoribbons 202 that are selectively applied to the polymer substrate 104 to form the tamper detection circuit 108, according to one embodiment.

FIG. 2 illustrates that, in some cases, each of the graphene nanoribbons 202 may include an alkylated graphene nanoribbon 204, with the letter R being used to represent functionalization of a graphene nanoribbon with alkyl groups. In a particular embodiment, the alkylated graphene nanoribbon 204 may include a hexadecyl graphene nanoribbon, an octyl graphene nanoribbon, or a butyl nanoribbon.

In a particular embodiment, the graphene nanoribbons 202 may be spray coated on the polymer substrate 104. As an illustrative, non-limiting example, functionalization of the graphene nanoribbons 202 with akyl groups, such as hexadecyl groups, may allow the graphene nanoribbons 202 to be dispersed in organic solvents, such as ortho-dichlorobenzene. An airbrush connected to compressed nitrogen may be used to spray coat the graphene nanoribbons 202 (dispersed in the organic solvent) onto the polymer substrate 104 that may be heated to about 200° C. At this temperature, the graphene nanoribbons 202 may form a substantially uniform film on the polymer substrate 104 with rapid evaporation of the solvent.

As a prophetic example, the alkylated graphene nanoribbon 204 illustrated in FIG. 2 may correspond to an alkyl functionalized graphene nanoribbon having dimensions (L×W) of 2-15 μm×40-250 nm with a BET surface area of 38 m$^2$/g, such as HD-GNRs available from Sigma-Aldrich Corporation (Product Number 797766). The HD-GNRs may be applied to a polymer substrate (e.g., a polyimide substrate, a PET substrate, a PC substrate) using the spray coating technique described above.

Figure 3:
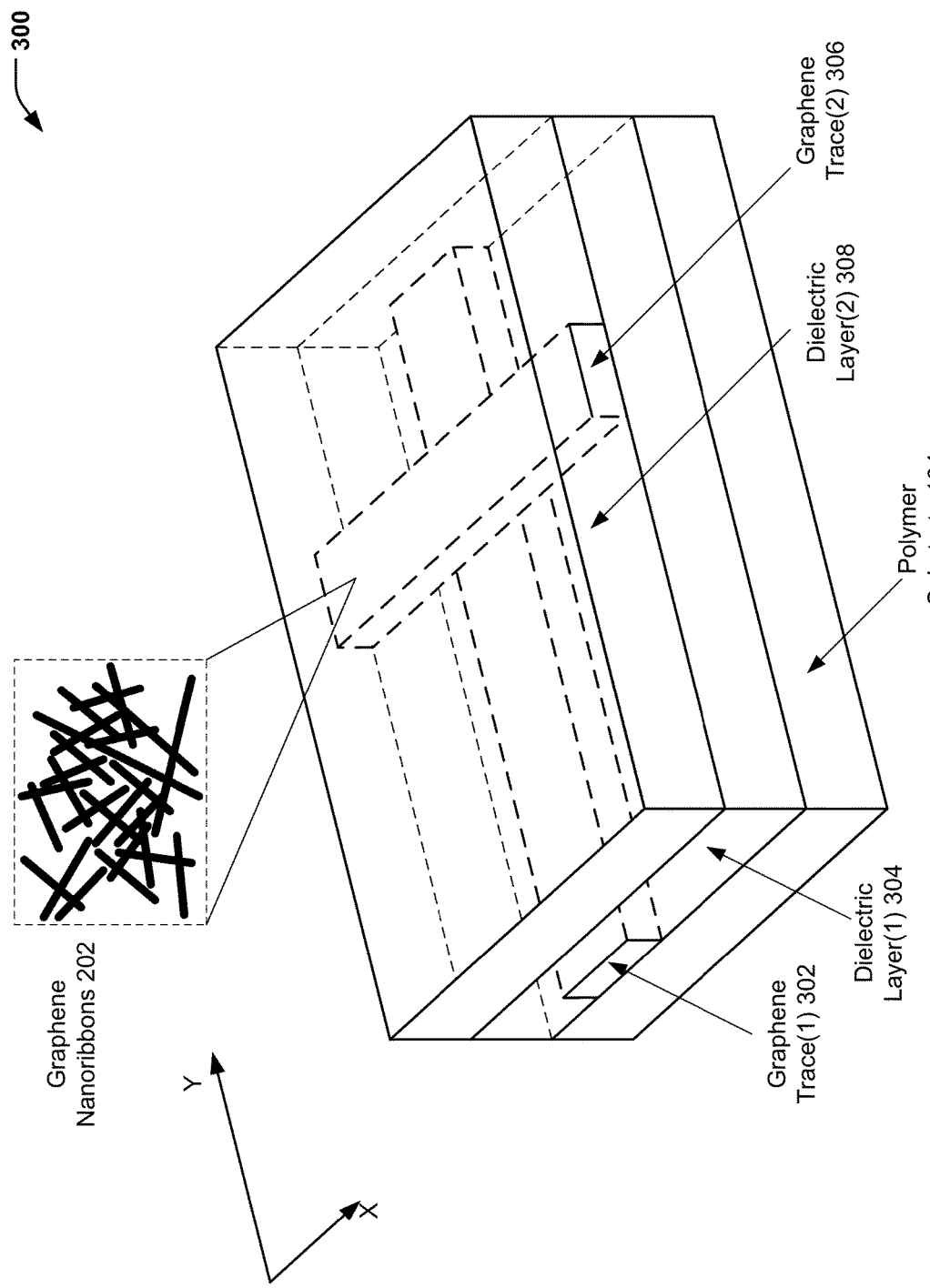
FIG. 3 is a diagram illustrating that a tamper detection circuit may include multiple layers of graphene traces that are selectively applied to form multiple trace patterns, according to one embodiment.

As illustrated and further described herein with respect to FIG. 3, after forming a first layer of graphene traces on the polymer substrate 104, a dielectric layer may be formed on the graphene traces, and one or more additional layers of graphene traces may be formed for tamper detection (e.g., an X-Y sensing grid). In a particular embodiment, each graphene trace may have a characteristic dimension in a range of about 2 millimeters to about 5 millimeters.

Thus, FIG. 2 illustrates an example of graphene nanoribbons (e.g., alkylated GNRs) being selectively applied in order to form graphene traces that are arranged to form a tamper detection circuit.

FIG. 3 is a diagram 300 illustrating a particular embodiment of a tamper detection circuit that includes multiple layers of graphene traces that are selectively applied to form multiple trace patterns. FIG. 3 illustrates a perspective view of a portion of a tamper detection circuit (e.g., the tamper detection circuit 108 of FIGS. 1 and 2). While FIG. 3 illustrates a particular example in which two layers of graphene traces are arranged to form an X-Y sensing grid, it will be appreciated that alternative numbers and/or arrangements of graphene traces may be formed (e.g., via the spray coating technique described above).

In the example of FIG. 3, a first set of graphene traces (including an illustrative first graphene trace 302) overlies the polymer substrate 104. The first graphene trace 302 may correspond to an "X-axis" trace of an X-Y sensing grid (as illustrated in the top views of the tamper detection circuit 108 shown in FIGS. 1 and 2). In a particular embodiment, each graphene trace of the first set of graphene traces (including the first graphene trace 302) may have a characteristic dimension in a range of about 2 millimeters to about 5 millimeters. In some cases, a spacing between X-axis graphene traces may be in a range of about 2 millimeters to about 5 millimeters. It will be appreciated that the X-axis graphene trace dimensions/spacing may be selected to satisfy a particular security standard, such as the FIPS 140-2 standard, which states that "[a]t this security level, the physical security mechanisms provide a complete envelope of protection around the cryptographic module with the intent of detecting and responding to all unauthorized attempts at physical access."

FIG. 3 illustrates that a first dielectric layer 304 may overly the first set of graphene traces. For example, a patterned layer may be formed on the polymer substrate 104 (e.g., using photolithography techniques), and the first graphene trace 302 may be formed on the patterned layer. FIG. 3 illustrates that the first graphene trace 302 may include the graphene nanoribbons 202 (e.g., the alkylated graphene nanoribbon 204 of FIG. 2). Application of the graphene nanoribbons 202 may include spray coating, as described further herein. Photoresist material may be removed after application of the first graphene trace 302. The first dielectric layer 304 may be applied after application of the first graphene trace 302 and optional removal of photoresist material.

FIG. 3 further illustrates that a second set of graphene traces (including an illustrative second graphene trace 306) overlies the first dielectric layer 304. The second graphene trace 306 may correspond to a "Y-axis" trace of an X-Y sensing grid (as illustrated in the top views of the tamper detection circuit 108 shown in FIGS. 1 and 2). In a particular embodiment, each graphene trace of the second set of graphene traces (including the second graphene trace 306) may have a characteristic dimension in a range of about 2 millimeters to about 5 millimeters. In some cases, a spacing between Y-axis graphene traces may be in a range of about 2 millimeters to about 5 millimeters. It will be appreciated that the Y-axis graphene trace dimensions/spacing may be selected to satisfy a particular security standard, such as the FIPS 140-2 standard.

FIG. 3 also illustrates that a second dielectric layer 308 may overly the second set of graphene traces. For example, a second patterned layer may be formed on the first dielectric layer 304. FIG. 3 illustrates that the second graphene trace 306 may include the graphene nanoribbons 202 (e.g., the alkylated graphene nanoribbon 204 of FIG. 2). Application of the graphene nanoribbons 202 may include spray coating, as described further herein. Photoresist material may be removed after application of the second graphene trace 306. The second dielectric layer 308 may be applied after application of the second graphene trace 306 and optional removal of photoresist material.

Thus, FIG. 3 illustrates an example of a portion of a tamper detection circuit that includes multiple layers of graphene traces that are selectively applied to form multiple trace patterns. While FIG. 3 illustrates a particular example in which two layers of graphene traces are arranged to form an X-Y sensing grid, it will be appreciated that alternative numbers and/or arrangements of graphene traces may be formed (e.g., via the spray coating technique described above). While FIG. 3 does not illustrate an opaque layer (e.g., the opaque layer 116 of FIG. 1), it will be appreciated that an opaque layer may be formed before or after "wrapping" a tamper protected device (e.g., the tamper protected device 102 of FIG. 1).

Figure 4:
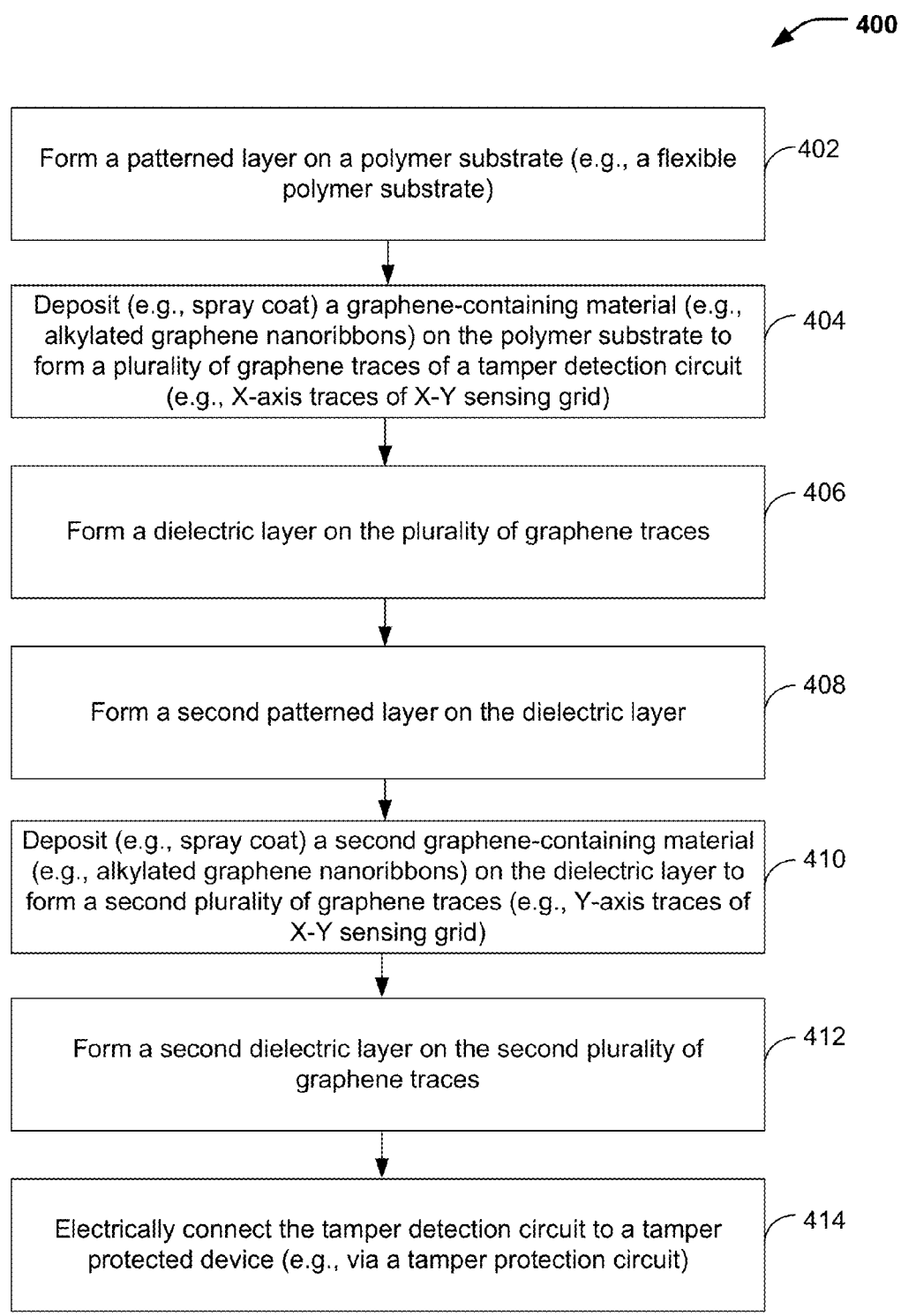
FIG. 4 is a flow diagram showing a particular embodiment of a process of forming a polymeric material having graphene traces that are arranged to form a tamper detection circuit.

FIG. 4 illustrates a particular embodiment of a process 400 of forming a polymeric material having graphene traces that are arranged to form a tamper detection circuit. In the particular embodiment illustrated in FIG. 4, the process 400 includes forming a tamper detection circuit with two layers of graphene traces for tamper detection (e.g., an X-Y sensing grid). In other embodiments, a tamper detection circuit may have an alternative number and/or arrangement of layers of graphene traces.

The process 400 includes forming a patterned layer on a polymer substrate, at 402. For example, referring to FIG. 3, a patterned layer may be formed on the polymer substrate 104. In a particular embodiment, the polymer substrate may include a thin, flexible polymer substrate (e.g., a polyimide substrate, a PET substrate, a polycarbonate substrate, etc.).

The process 400 includes depositing a graphene-containing material on the patterned layer to form a plurality of graphene traces of a tamper detection circuit, at 404. For example, referring to FIG. 3, the graphene-containing material may include the graphene nanoribbons 202 (such as the alkylated graphene nanoribbon 204 illustrated in FIG. 2). The graphene nanoribbons 202 may be spray coated onto the polymer substrate 104 using spray coating techniques described herein to form the plurality of graphene traces (including the first graphene trace 302 corresponding to an illustrative example of an X-axis trace of an X-Y sensing grid).

The process 400 includes forming a dielectric layer on the plurality of graphene traces, at 406. For example, referring to FIG. 3, the first dielectric layer 304 may be formed on the plurality of graphene traces (including the first graphene trace 302).

In the particular embodiment illustrated in FIG. 4, the process 400 includes forming a second patterned layer on the dielectric layer, at 408. For example, referring to FIG. 3, the second patterned layer may be formed on the first dielectric layer 304.

In the example of FIG. 4, the process 400 includes depositing a second graphene-containing material on the second patterned layer to form a second plurality of graphene traces, at 410. For example, referring to FIG. 3, the second graphene-containing material may include the graphene nanoribbons 202 (such as the alkylated graphene nanoribbon 204 illustrated in FIG. 2). The graphene nanoribbons 202 may be spray coated onto the first dielectric layer 304 using spray coating techniques described herein to form the second plurality of graphene traces (including the second graphene trace 306 corresponding to an illustrative example of a Y-axis trace of an X-Y sensing grid).

In the example of FIG. 4, the process 400 includes forming a second dielectric layer on the second plurality of graphene traces, at 412. For example, referring to FIG. 3, the second dielectric layer 308 may be formed on the second plurality of graphene traces (including the second graphene trace 306).

The process 400 may include electrically connecting the tamper detection circuit to a tamper protected device (e.g., via a tamper protection circuit), at 414. For example, referring to FIG. 1, the tamper detection circuit 108 may be electrically connected to the tamper protected device 110 via the tamper protection circuit 114.

Thus, FIG. 4 illustrates an example of a process of forming a polymeric material having graphene traces that are arranged to form a tamper detection circuit. In the example of FIG. 4, multiple layers of graphene traces are utilized to form an X-Y sensing grid.

The previous description of the disclosed embodiments is provided to enable a person skilled in the art to make or use the disclosed embodiments. Various modifications to these embodiments will be readily apparent to those skilled in the art, and the generic principles defined herein may be applied to other embodiments without departing from the scope of the disclosure. Thus, the present disclosure is not intended to be limited to the embodiments shown herein but is to be accorded the widest scope possible consistent with the principles and features as defined by the following claims.

The invention claimed is:

1. An apparatus comprising:
   a tamper detection circuit including a memory that includes sensitive data;
   a polymer substrate positioned around at least a portion of the memory;
   a plurality of graphene traces formed as a layer of graphene traces on the polymer substrate, wherein the as-formed layer of graphene traces is invisible to an unaided eye; and
   a tamper protection circuit electrically connected to the as-formed layer of graphene traces, wherein the tamper protection circuit is configured to detect a tampering event that is incident on the as-formed layer of graphene traces and to render the sensitive data inaccessible.

2. The apparatus of claim 1, wherein the tamper protection circuit is configured to perform one or more tamper response operations responsive to the indication of the tamper event.

3. The apparatus of claim 2, wherein the one or more tamper response operations include erasing data stored at the memory.

4. The apparatus of claim 2, wherein the one or more tamper response operations include disabling a component.

5. The apparatus of claim 1, wherein the tamper protection circuit includes a cryptographic module.

6. The apparatus of claim 1, wherein the tamper protection circuit is enclosed within a housing, and wherein the tamper protection circuit is disposed on the polymer substrate.

7. The apparatus of claim 1, wherein the graphene traces include alkylated graphene nanoribbons.

8. The apparatus of claim 1, wherein the as-formed layer of graphene traces is spray-painted.

9. The apparatus of claim 1, wherein the as-formed layer of graphene traces is optically transparent.

10. The apparatus of claim 1, wherein each graphene trace has a characteristic dimension in a range of about 2 millimeters to about 5 millimeters.

11. The apparatus of claim 1, wherein the polymer substrate is heated prior to forming the layer of graphene traces.

* * * * *